(12) United States Patent
Taoka

(10) Patent No.: US 6,350,977 B2
(45) Date of Patent: *Feb. 26, 2002

(54) PATTERN DISTORTION DETECTING METHOD AND APPARATUS AND RECORDING MEDIUM FOR PATTERN DISTORTION DETECTION

(75) Inventor: Hironobu Taoka, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/360,640

(22) Filed: Jul. 26, 1999

(30) Foreign Application Priority Data

Jan. 25, 1999 (JP) .......................... 11-015676

(51) Int. Cl.⁷ .................................. G01J 1/36
(52) U.S. Cl. ................ 250/204; 250/201; 250/209; 348/308
(58) Field of Search ................ 348/308, 162, 348/302, 304; 250/204, 370, 378, 208, 98; 324/757, 96, 762; 395/500

(56) References Cited

U.S. PATENT DOCUMENTS

| 4,384,199 A | * | 5/1983 | Ogino et al. ............... 250/204 |
| 5,331,275 A | * | 7/1994 | Ozaki et al. ............... 324/757 |
| 5,812,191 A | * | 9/1998 | Orava et al. ............... 348/308 |
| 6,081,658 A | * | 6/2000 | Rieger et al. .............. 395/500 |

FOREIGN PATENT DOCUMENTS

| JP | 6-177021 | | 6/1994 | |
| JP | 2000214577 | * | 8/2000 | ................ 1/8 |

OTHER PUBLICATIONS

"An Automated Method to Check Sidelobe Overlap Projected by Adjacent Apertures in Attenuated Phase–shift Masks", K. Nakajo et al., SPIE vol. 3096, pp. 154–162.

"Simulation–Based Automatic Optical Proximity Effect Correction Adaptive for Device Fabrication", K. Tsudaka et al., Jpn. J. Appl. Phys., vol. 36 (1997) pp. 7477–7481.

* cited by examiner

Primary Examiner—Charles Bowers
Assistant Examiner—Laura M Schillinger
(74) Attorney, Agent, or Firm—McDermott, Will & Emery

(57) ABSTRACT

Sampling points are generated selectively in a prescribed portion other than the pattern edge portion of a layout pattern used in a semiconductor manufacturing process based on an input that is data of the layout pattern. Simulation results of a pattern to be generated from the layout pattern are obtained for the respective sampling points. Pattern distortion amounts in the portion other than the pattern edge portion are detected by comparing the data of the layout pattern and the simulation results for the respective sampling points.

11 Claims, 16 Drawing Sheets

PATTERN DISTORTION DETECTING METHOD AND APPARATUS AND RECORDING MEDIUM FOR PATTERN DISTORTION DETECTION

BACKGROUND OF THE INVENTION

1. Field of the Invention

The present invention relates to an improved pattern distortion detecting method and apparatus that are applied to pattern formation in a semiconductor manufacturing process, as well as to a recording medium on which a program to be used for performing such pattern distortion detection by using a computer is recorded.

2. Background Art

At present, the design rules of semiconductor devices have reached the 0.15-μm level and this value is smaller than light source wavelengths (0.248 μm in the case of using an excimer laser) of steppers for transfer of such patterns. Since the resolution performance deteriorates significantly in this circumstance, it is attempted to improve the resolution performance by using a special transfer technique such as a modified illumination technique.

Where such a special transfer technique is used, the pattern fidelity deteriorates though the resolution performance is improved. Also in other processes such as an etching process, variations in pattern dimensions may occur owing to differences in the density of miniaturized patterns.

To solve the above problems, the OPC (Optical Proximity Effect Correction) is widely employed which modifies design layout patterns so as to obtain desired patterns. It is assumed here that the OPC means the method to correct pattern distortions in general that result from not only optics-related causes but also process-related ones.

The OPC is classified into three kinds of methods. The first method is a model-based OPC in which patterns are modified based on simulation results. The second method is a rule-based OPC in which rules (OPC rules) according to which to modify design layout patterns are set in advance in consideration of geometrical features of the design layout patterns such as widths of respective patterns, distances between adjacent patterns, and distances from corner portions, and the design layout patterns are modified according to those rules. The third method is a combination of the first and second methods.

The pattern distortion detection for checking whether desired finish patterns will be obtained correctly by using OPC results is important.

In all of the above processes except the rule-based OPC, it is necessary to perform a simulation by using, as an input, design layout patterns or post-OPC patterns.

FIG. 20 shows the configuration of a conventional pattern distortion detecting apparatus. In FIG. 20, a layout pattern holding section 1 stores layout patterns to be used for prediction of pattern distortions. An on-edge sampling point generation rule holding section 7 holds rules according to which to generate sampling points on pattern edges of layout patterns. An on-edge sampling point generating means 2 generates sampling points on pattern edges. A pattern distortion predicting means 3 predicts pattern distortion amounts by performing simulations for the respective generated sampling points. A pattern distortion correcting means 4 corrects the layout patterns in accordance with the predicted pattern distortion amounts. Processing results are output to a pattern distortion information holding section 5 and/or a corrected layout pattern holding section 6.

When pattern distortion detection is performed by using the above conventional pattern distortion detecting apparatus, the processes from the layout pattern holding section 1 to the pattern distortion predicting means 3 are executed and, as a result, pattern distortion information is obtained in the pattern distortion information holding section 5. When a pattern distortion correction is performed, the processes from the layout pattern holding section 1 to the pattern distortion correcting means 4 are executed and, as a result, corrected layout patterns are obtained in the corrected layout pattern holding section 6.

Next, the operation of the conventional pattern distortion detecting apparatus, that is, a conventional pattern distortion detecting method, will be described.

FIG. 21 is a flowchart of the conventional pattern distortion detecting method.

Steps 21–23 shown in FIG. 21 are executed for a pattern distortion check and steps 21–22 and 24–26 are executed for a pattern distortion correction. All the steps are executed when both are needed.

First, at step 21 shown in FIG. 21, sampling points are generated on the edge portion of a layout pattern stored in the layout pattern holding section 1 according to on-edge sampling point generation rules that are stored in the on-edge sampling point generation rule holding section 7 shown in FIG. 20. The sampling point generation rules will be described later.

At step 22, a pattern to be generated from the layout pattern is simulated for the respective sampling points and pattern distortion amounts are thereby calculated. At step 23, pattern distortion information is output to the pattern distortion information holding section 5 shown in FIG. 20.

At step 24, the pattern is modified so as to cancel out the pattern distortion amounts calculated at step 22. The most typical method is to move the pattern edge in the direction opposite to the direction of the pattern distortion by the pattern distortion amounts. (There is a method in which after the pattern edge is moved by a predetermined amount at the first attempt, corrections and checks (the checking method will be described below) are repeated.)

At step 25, to detect whether the correction has been made correctly, it is judged whether to re-execute steps 22–24. Usually, a judgment criterion is set such that the process is to proceed to step 26 if the number of iterations of steps 22–24 has exceeded a predetermined number or the pattern distortion amounts have fallen within a specified value.

At step 26, a corrected pattern is output to the corrected layout pattern holding section 6 shown in FIG. 20.

The conventional pattern distortion check and correction are performed according to the above process.

A specific example of a conventional sampling point generation method will be described below. The sampling point generation is important in the present invention.

FIG. 22 shows an example in which sampling points are set all over an input layout pattern to be simulated and simulations are performed for the respective sampling points. In FIG. 22, a layout pattern 1 is hatched and sampling points 3 are indicated by mark "x." Reference symbol 1a denotes pattern edges. This method has a problem of a very long processing time because calculations need to be performed for an enormous number of sampling points.

In view of the above, as shown in FIG. 23, it is a common practice to set sampling points 3 only on the pattern edges 1a that greatly affect the accuracy of pattern dimensions, whereby the number of sampling points is reduced and the calculation time is shortened.

FIG. 24 shows sampling points that are set in a case where a plurality of layout patterns exist. In FIG. 24, reference symbol 1 denotes a layout pattern; 1a, its pattern edges; 3, sampling points; 7, a layout pattern in another layer; and 8, another layout pattern in the same layer as the layout pattern 1.

In this manner, it is attempted to further reduce the number of sampling points and increase the processing speed by setting the sampling points 3 on the pattern edges 1a selectively in accordance with presence/absence of the adjacent layout pattern 8 and the layout pattern 7 in another layer and conditions relating to corners etc. and causing simulation results of the sampling points 3 to represent values of the entire edges.

However, the above conventional method cannot detect and correct a pattern distortion in a portion distant from a pattern edge that occurs, for example, in a halftone mask or in the case of an abnormally large pattern distortion.

FIG. 25 shows a specific example of a halftone mask (described later in detail). In FIG. 25, reference numeral 1 denotes layout patterns and 9 denotes a pattern distortion in a portion distant from edge portions 1a. It is known that a pattern distortion like the pattern distortion 9 can be corrected by generating a figure that is smaller in size than a resolution limit in the pattern distortion portion. A figure that is generated in such a situation may be an opaque portion or a transparent portion.

As described above, although the conventional method can detect a pattern distortion by setting sampling points on pattern edges, it cannot detect a pattern distortion in a portion distant from a pattern edge, for example, it cannot detect and correct a pattern distortion in a portion distant from a pattern edge that occurs, for example, in a halftone mask or in the case of an abnormally large pattern distortion.

The present invention has been made to solve the above problems in the art, and relates to a pattern distortion detecting apparatus and a pattern distortion correcting apparatus which detect and correct, respectively, a portion where a pattern distortion occurs by predicting a pattern distortion that will occur in a pattern forming process such as a photolithography or etching process executed in semiconductor manufacture and checking differences between a predicted layout pattern and a design layout pattern. An object of the invention is to make it possible to predict, at high speed, pattern distortion amounts in a portion other than the pattern edges and detect and correct a pattern distortion in a portion other than the pattern edges by setting sampling points selectively also in portions other than the pattern edges.

FIGS. 26(a) and 26(b) illustrate a conventional VTR (Variable Threshold Resist) model. In FIG. 26(a), reference symbol 1 denotes a layout pattern, 1a denotes a pattern edge, and 3 denotes a sampling point. In FIG. 26(b), the horizontal axis represents the position on a line segment that intersects the pattern edge 1a at the sampling point 3 and the vertical axis represents a physical quantity in pattern formation.

As shown in FIGS. 26(a) and 26(b), in the VTR model, the pattern distortion amount in the pattern edge portion is calculated at the sampling point 3 in accordance with the gradient of a process quantity such as optical intensity. Therefore, gradient calculation points 9 for a simulation are set in the vicinity of the sampling point 3 on the pattern edge 1a. This is to determine the pattern distortion amount on the pattern edge 1a more accurately by calculating a gradient.

The invention is much different from the conventional method in that sampling points are set selectively in a portion distant from an edge to calculate a process quantity such as optical intensity in a portion other than the edge portion. That is, in the present invention, where the VTR model is used, calculations are performed by setting gradient calculation points additionally in the vicinity of a sampling point that is set in a portion other than an edge portion.

SUMMARY OF THE INVENTION

According to one aspect of the present invention, in a pattern distortion detecting method, sampling points are selectively generated in a prescribed portion other than a pattern edge portion of a layout pattern used in a semiconductor manufacturing process based on an input that is data of the layout pattern. Simulation results for the respective sampling points are obtained regarding a pattern to be generated from the layout pattern. Then, pattern distortion amounts for the respective sampling points are detected in the portion other than the pattern edge portion by comparing the data of the layout pattern and the simulation results.

In another aspect of the invention, further a corrected layout pattern is generated by correcting the layout pattern based on the detected pattern distortion amounts.

According to another aspect of the present invention, a pattern distortion detecting apparatus conducting the above mentioned method is provided.

Further, according to another aspect of the present invention, a computer-readable recording medium is provided on which a program is recorded for causing a computer to execute the above mentioned method.

Other and further objects, features and advantages of the invention will appear more fully from the following description.

DETAILED DESCRIPTION OF THE PREFERRED EMBODIMENTS

Figure 1:
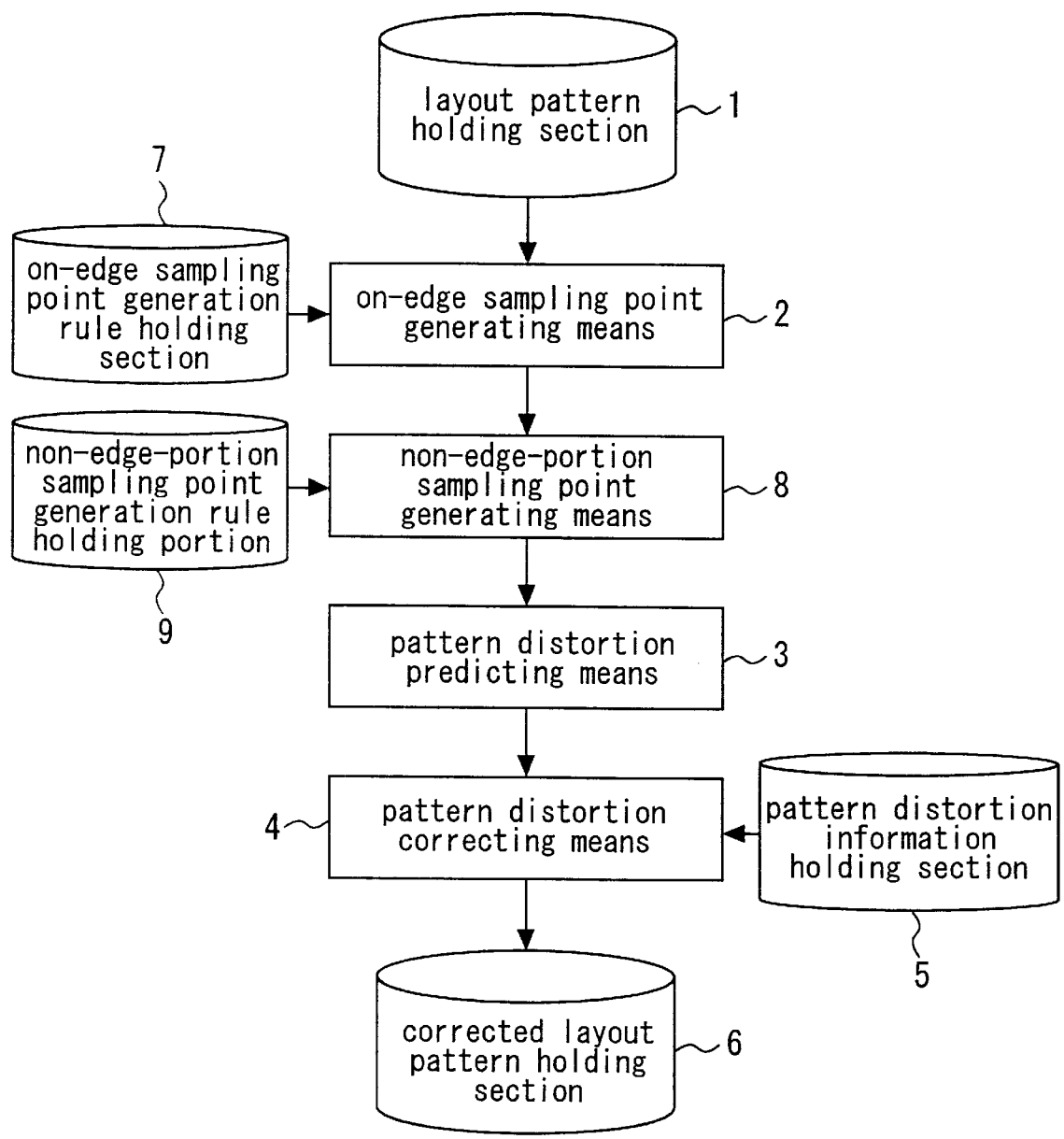
FIG. 1 is a block diagram showing the configuration of a pattern distortion detecting apparatus according to a first embodiment of the present invention.

Some embodiments of the present invention will be hereinafter described. In the drawings, the same or corresponding components are given the same reference symbols and descriptions therefor may be simplified or omitted.

First Embodiment

FIG. 1 is a block diagram showing the configuration of a pattern distortion detecting apparatus according to a first embodiment of the present invention.

In FIG. 1, a layout pattern holding section 1 stores layout patterns to be used as references for prediction of pattern distortions. (In the following description, a layout pattern may be abbreviated as a pattern.) An on-edge sampling point generation rule holding section 7 holds rules according to which to generate sampling points on pattern edges of layout patterns. An on-edge sampling point generating means 2 generates sampling points on pattern edges based on data that are input from the layout pattern holding section 1 and the on-edge sampling point generation rule holding section 7.

A non-edge-portion sampling point generation rule holding portion 9 holds rules according to which to generate sampling points selectively in prescribed portions other than the pattern edge portions. The term "other than the pattern edge portions" has the same meaning as "not on the pattern edges." A non-edge-portion sampling point generating means 8 generates sampling points selectively in prescribed portions other than the pattern edge portions based on data that are input from the layout pattern holding section 1 and the non-edge-portion sampling point generation rule holding section 9.

A pattern distortion predicting means 3 predicts pattern distortion amounts by simulating patterns to be generated from the layout patterns for the respective sampling points generated by the on-edge sampling point generating means 2 and for the respective sampling points generated by the non-edge-portion sampling point generating means 8 and comparing simulation results with the layout pattern data.

A pattern distortion correcting means 4 corrects the layout patterns in accordance with the pattern distortion amounts predicted by the pattern distortion predicting means 3, and generates corrected layout patterns.

A pattern distortion information holding section 5 holds an output, that is, processing results, of the pattern distortion predicting means 3.

A corrected layout pattern holding section 6 holds an output, that is, processing results, of the pattern distortion correcting means 4.

Figure 20:
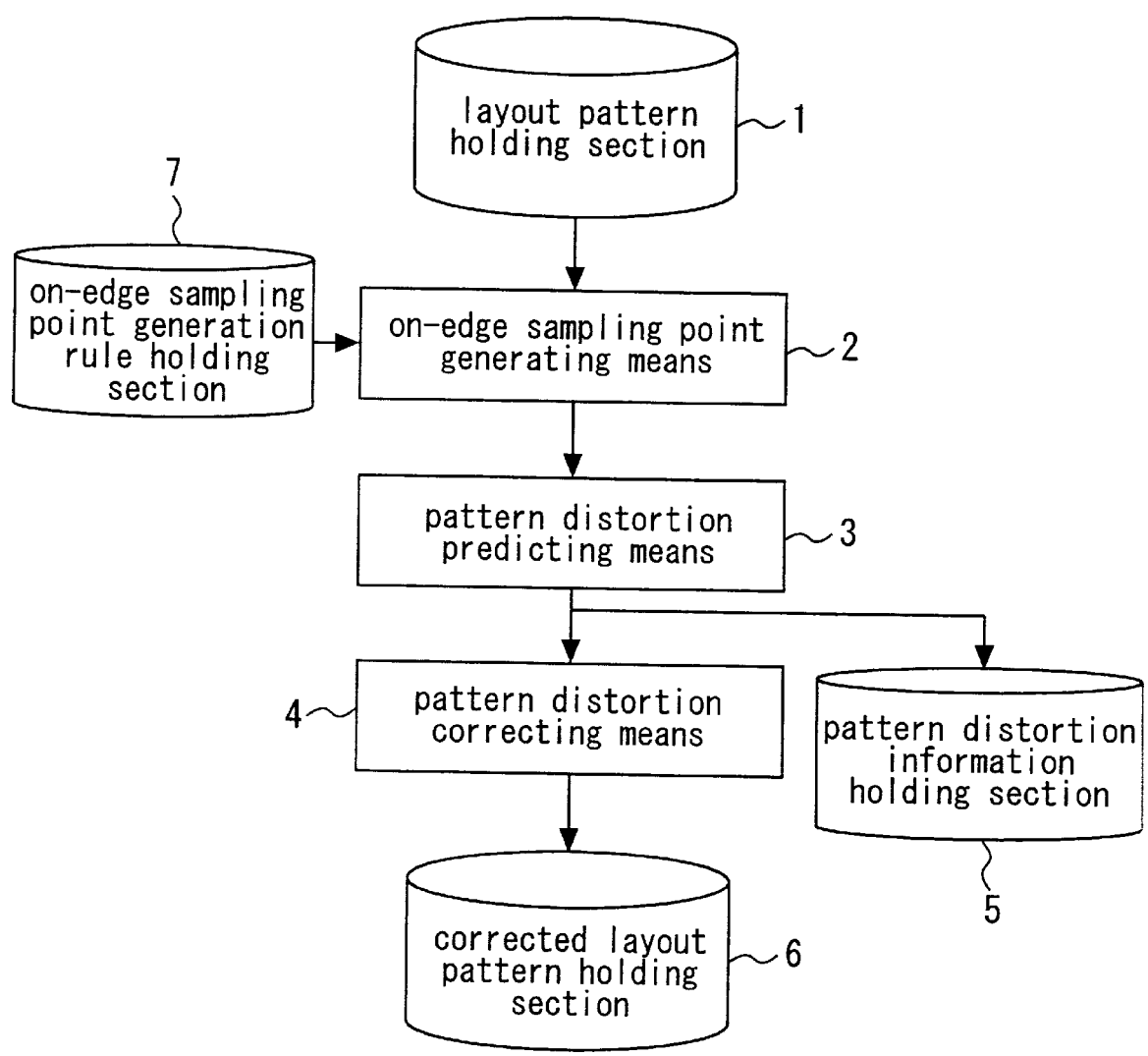
FIG. 20 shows the configuration of a conventional pattern distortion detecting apparatus.

In the above configuration, the components 1–7 are the same as or correspond to those of the conventional apparatus shown in FIG. 20. The above configuration is different from the conventional one in that the former includes the non-edge-portion sampling point generating means 8 that receives data from the non-edge-portion sampling point generation rule holding section 9.

Figure 2:
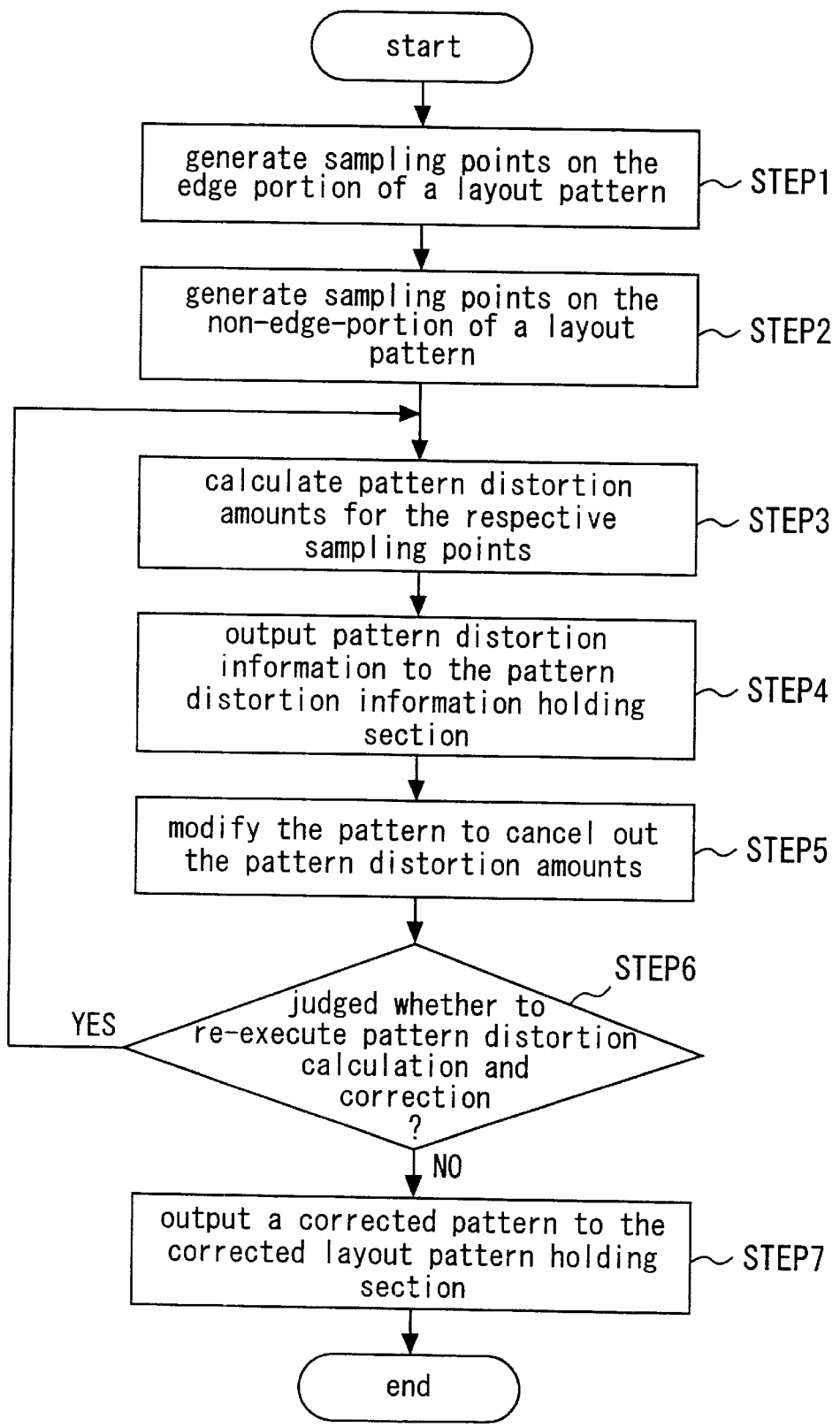
FIG. 2 is a flowchart of the pattern distortion detecting method according to the first embodiment.

Next, the operation of the pattern distortion detecting apparatus of FIG. 1, that is, a pattern distortion detecting method according to the first embodiment, will be described. FIG. 2 is a flowchart of the pattern distortion detecting method according to the first embodiment.

First, at step 1 shown in FIG. 2, sampling points are generated selectively on the edge portion of a layout pattern that is stored in and output from the layout pattern holding section 1 according to on-edge sampling point generation rules that are stored in the on-edge sampling point generation rule holding section 7 shown in FIG. 1. A specific example of the sampling point generation rules will be described later.

At step 2, sampling points are generated selectively in a prescribed portion other than the edge portion of the layout pattern that is stored in and output from the layout pattern holding section 1 according to non-edge-portion sampling point generation rules that are stored in the non-edge-portion sampling point generation rule holding section 9 shown in FIG. 1. A specific example of the sampling point generation rules will be described later.

At step 3, a pattern to be generated from the layout pattern is simulated for the respective sampling points generated at steps 1 and 2 and pattern distortion amounts are calculated by comparing simulation results with the layout pattern data.

At step 4, pattern distortion information is output to the pattern distortion information holding section 5 shown in FIG. 1.

At step 5, the pattern is modified so as to cancel out the pattern distortion amounts calculated at step 4. The most typical method is to move the pattern edge in the direction opposite to the direction of the pattern distortion by the pattern distortion amounts. (There is a method in which after the pattern edge is moved by a predetermined amount at the first attempt, corrections and checks (the checking method will be described below) are repeated.)

At step 6, to detect whether the correction has been made correctly, it is judged whether to re-execute steps 3–5. Usually, a judgment criterion is set such that the process is to proceed to step 7 if the number of iterations of steps 3–5 has exceeded a predetermined number or the pattern distortion amounts have fallen within a predetermined value.

At step 7, a corrected pattern is output to the corrected layout pattern holding section 6 shown in FIG. 1.

The pattern distortion check and correction are performed according to the above process. Steps 1–4 shown in FIG. 2 are executed when only the pattern distortion check is needed, and steps 1–3 and 5–7 are executed for the pattern distortion correction. All the steps are executed when both are needed.

Figure 21:
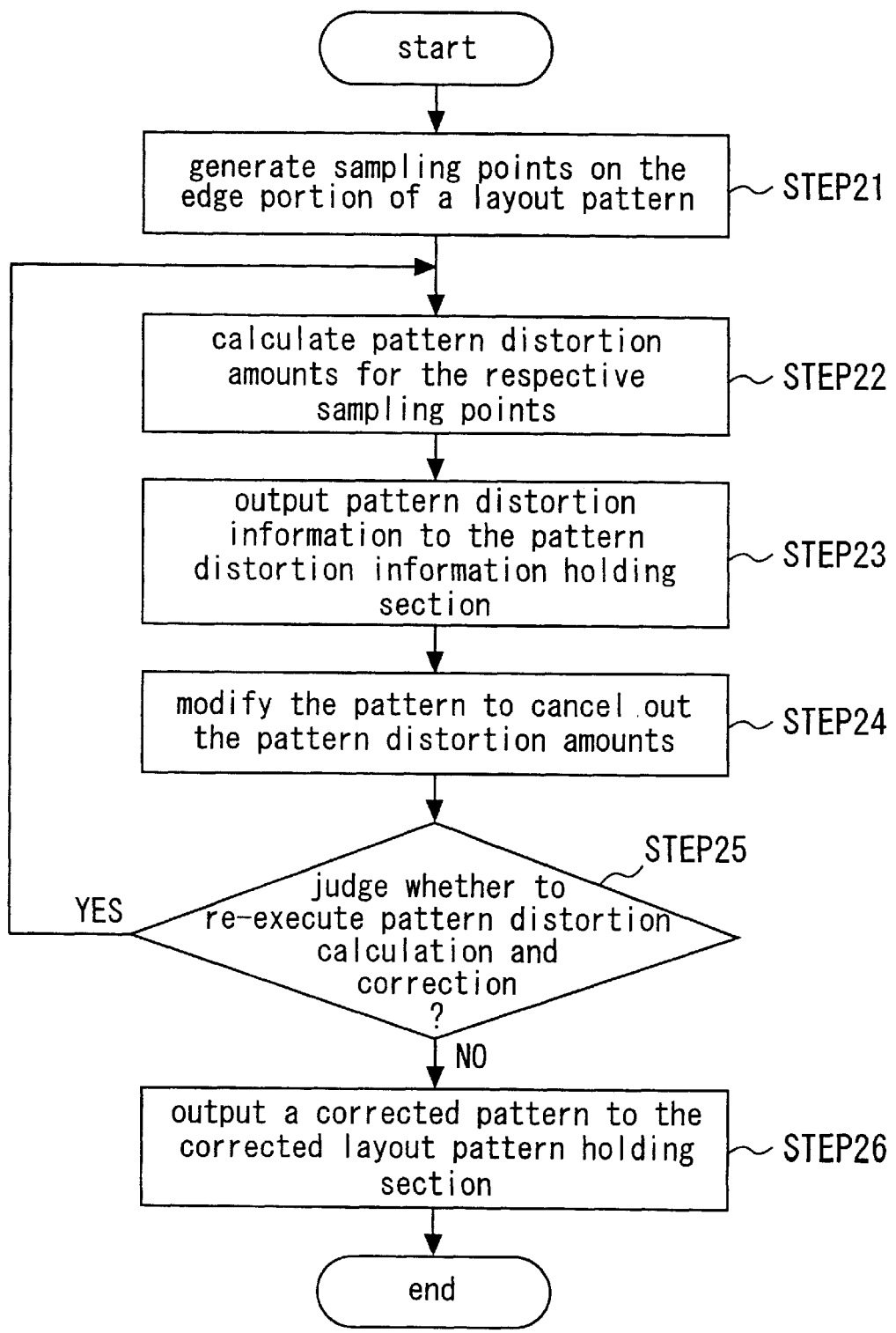
FIG. 21 is a flowchart of the conventional pattern distortion detecting method.
Figure 22:
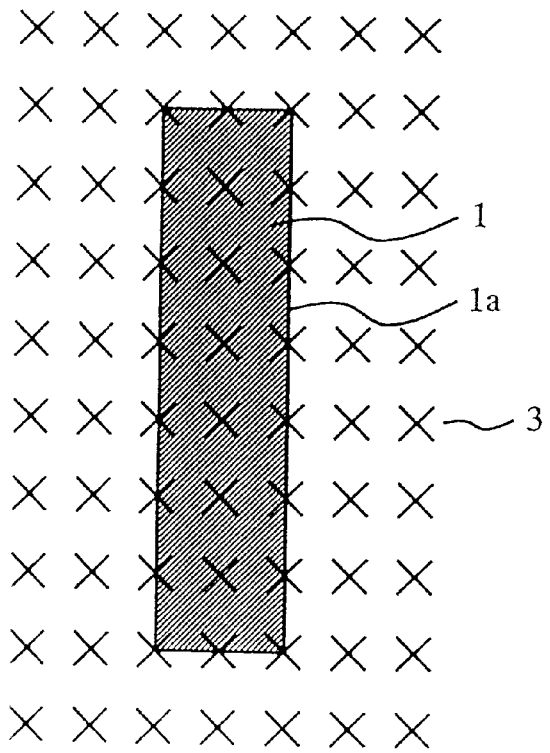
FIGS. 22 through 24 show example of the sampling points in a conventional pattern distortion detecting method.
Figure 23:
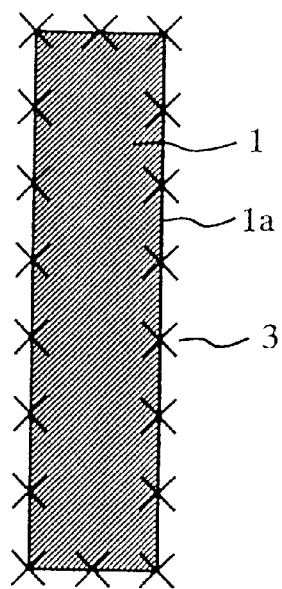
Figure 24:
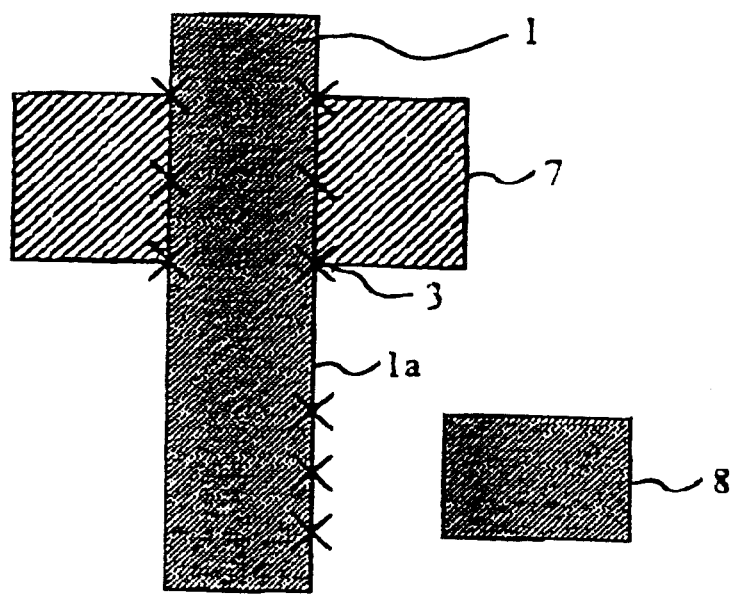

In the above-described operation of the first embodiment, step 1 and steps 3–7 of FIG. 2 are the same or correspond to step 21 and steps 22–26 of the conventional operation of FIG. 21, respectively.

The operation of the first embodiment is novel in the presence of step 2 where sampling points are set selectively in a portion other than the edges according to the rules that are stored in the non-edge-portion sampling point generation rule holding section 9. Since pattern distortion amounts can be calculated and corrected for the sampling points generated at step 2 in addition to the sampling points generated in the same manner as in the conventional method, a pattern distortion distant from a pattern edge can be detected and corrected at high speed.

Although the above description is directed to the case where the apparatus includes both of the on-edge sampling point generating means 2 and the non-edge-portion sampling point generating means 8, the on-edge sampling point generating means 2 is unnecessary when it is intended to detect and correct pattern distortions in portions other than the edge portions; that is, the on-edge sampling point generating means 2 and the on-edge sampling point generation rule holding section 7 may be omitted. It is apparent that the same advantages can be obtained even if they are omitted.

It is also apparent that the same advantages can be obtained even if the order of execution of the steps of the on-edge sampling point generating means 2 and the non-edge-portion sampling point generating means 8 is reversed.

As described above, in this embodiment, sampling points are set selectively in a portion other than a pattern edge portion based on an input that is layout pattern data and simulation results are obtained for the respective sampling points, whereby pattern distortion amounts in the portion other than the pattern edge portion are calculated.

In this embodiment, since sampling points are set selectively in a portion other than a pattern edge portion and pattern distortion amounts are detected at the respective sampling points, a pattern distortion distant from the pattern edge portion can be detected and corrected at high speed.

The above-described pattern distortion detecting method can be implemented by recording its steps on a recording medium in the form of a computer-readable program so that they can be executed by a computer and causing the computer to operate according to the prescribed procedure of the program.

Further, the above-described pattern distortion detecting apparatus can be implemented by a computer that includes a storing means for storing pattern data and sampling point generation rules and an operation means for performing operations such as sampling point generation, pattern distortion prediction, and pattern distortion correction and that is loaded with a program as mentioned above.

That is, a recording medium according to the present invention is a computer-readable recording medium on which a program to be executed by a computer is recorded, the program including:

a processing program for generating sampling points selectively in a prescribed portion other than the pattern edge portion of a layout pattern used in a semiconductor manufacturing process according to a rule for generating sampling points selectively in a prescribed portion other than the pattern edge portion of a layout pattern based on an input that is data of the layout pattern;

a processing program for obtaining simulation results of a pattern to be generated from the layout pattern for the respective sampling points; and a processing program for detecting pattern distortion amounts in the portion other than the pattern edge portion by comparing the data of the layout pattern and the simulation results for the respective sampling points.

Second Embodiment

A pattern distortion detecting apparatus and method according to a second embodiment of the invention, which are similar to those of the first embodiment, will be described below with auxiliary reference to FIGS. 1 and 2. The components and operations in the second embodiment that are the same as in the first embodiment will be described in a simplified manner or will not be described at all to avoid redundant descriptions.

In particular, the second embodiment is different from the first embodiment in that non-edge-portion sampling point generation rules that are held by the non-edge-portion sampling point generation rules holding section 9 shown in FIG. 1 are assumed to be as follows.

Sampling point generation rules: "generate a sampling line in a portion distant from a pattern edge by a predetermined value and set sampling points selectively on the sampling line."

Figure 3:
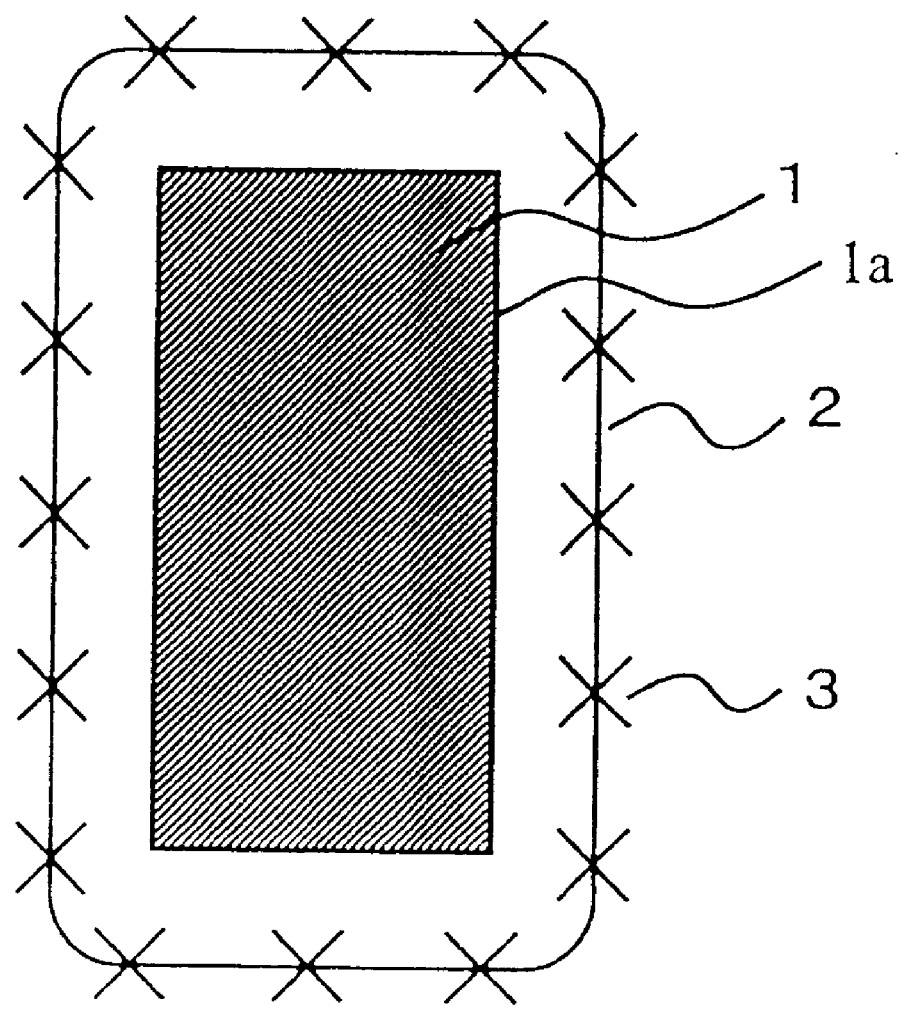
FIG. 3 illustrates a relationship between a layout pattern and sampling points for description of the second embodiment.

FIG. 3 illustrates a relationship between a layout pattern and sampling points for description of the second embodiment. In FIG. 3, reference symbol 1 denotes a layout pattern; 1a, pattern edges; 2, a sampling line; and 3, sampling points. In this embodiment, the sampling line 2 is a set of points that are distant from the pattern edges 1a of the layout pattern 1 by a predetermined value. The sampling points 3 are generated on the sampling line 2.

Although in FIG. 3 the sampling line 2 is generated only outside the pattern 1, it may be generated inside the pattern 1 or both inside and outside the pattern 1, to apparently provide the same advantages.

Figure 4:
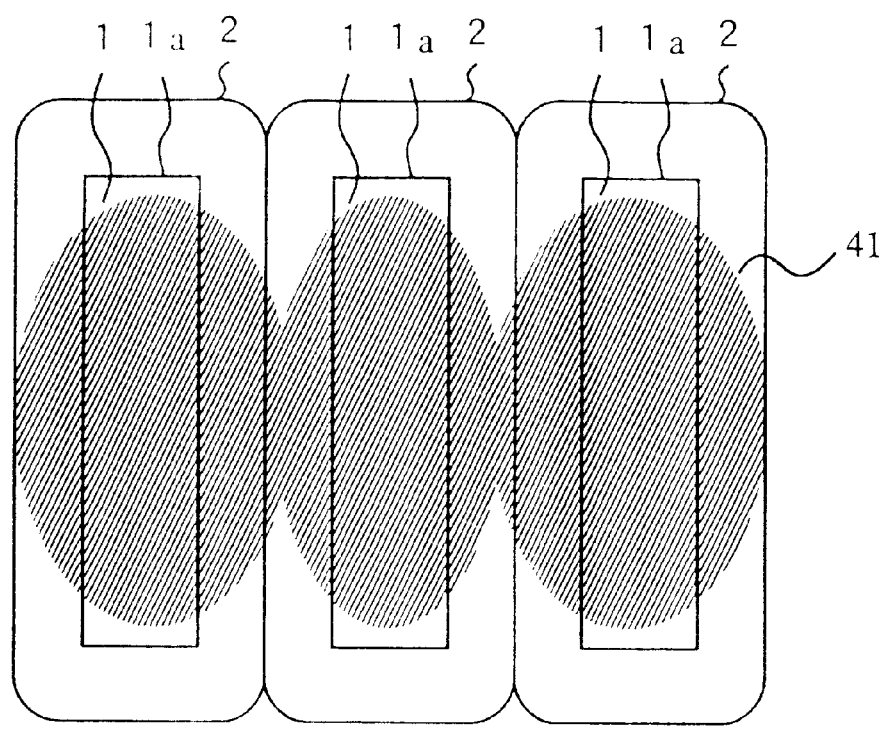
FIG. 4 illustrates another example of a layout pattern to apply the second embodiment.

FIG. 4 shows line-and-space patterns 1 and a calculation result of optical intensity by a simulation in which the patterns 1 were used as an input. Reference numeral 41 denotes an optical image, indicated by a contour, of a portion having a certain optical intensity value.

A phenomenon that an image as an optical intensity calculation result is very distant from layout pattern edges in a manner as shown in FIG. 4 occurs in a case where an optical intensity threshold value is greatly deviated from a value that determines a pattern dimension, a case where a high degree of defocusing is made, a case where a pattern dimension is much shorter than an exposure wavelength, and other cases. As shown in FIG. 4, the optical intensity of bridging portions of the optical image 41 can be detected by setting sampling lines 2 at the center positions of the spaces of the line-and-space patterns 1 and setting sampling points on the sampling lines 2.

Figure 5:
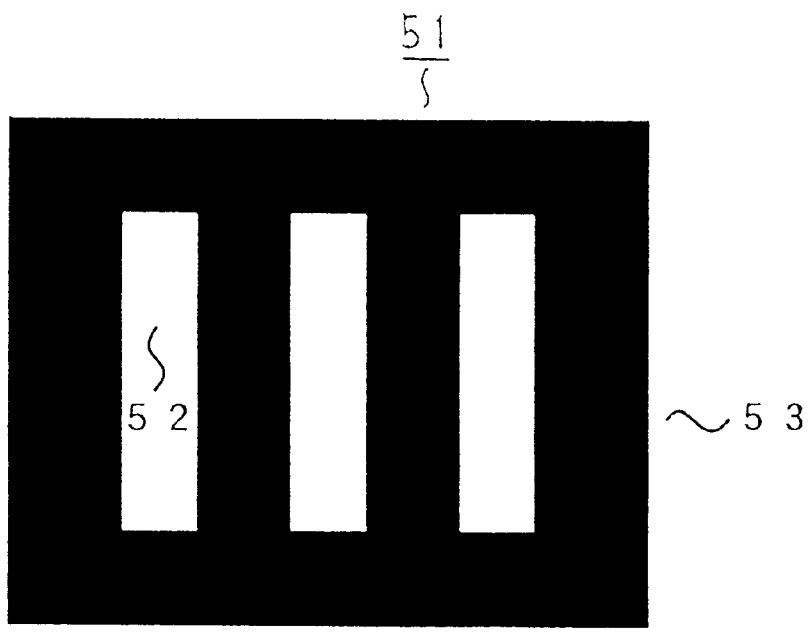
FIG. 5 shows an ordinary photomask.
Figure 6:
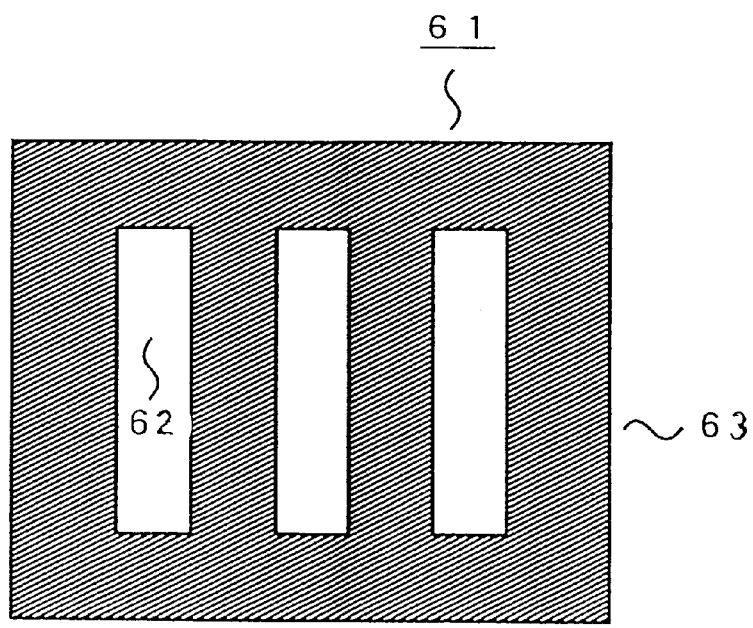
FIG. 6 shows a halftone mask for explaining the second embodiment.

A more remarkable example is a case of using a halftone mask. FIG. 5 shows an ordinary photomask 51 and FIG. 6 shows a halftone mask 61. The ordinary photomask 51 shown in FIG. 5 is composed of transparent portions 52 for transmitting light and an opaque portion 53 for interrupting light. On the other hand, the halftone mask 61 shown in FIG. 6 is composed of transparent portions 62 and a phase shifter portion 63 for transmitting light at a certain ratio and shifting its phase. (A halftone mask sometimes includes an opaque portion for interrupting light completely that occupies part of the mask.) In general, halftone masks improve the pattern resolution by making the optical intensity gradient in pattern edge portions steeper by reversing the phases inside and outside the pattern edges. However, halftone masks have the following problem.

Figure 7:
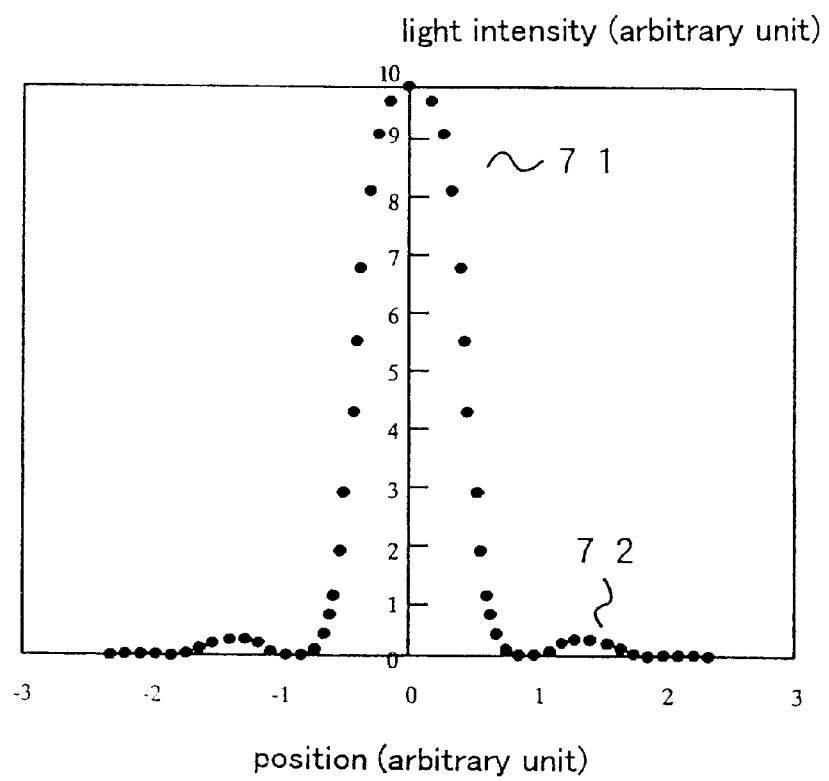
FIG. 7 shows an intensity profile of light that has passed through a rectangular transparent portion.

FIG. 7 shows an intensity profile on a wafer of light that has passed through a rectangular transparent portion. As is commonly known, a zeroth-order light intensity peak 71 and first-order light intensity peaks 72 occur. Although even higher order peaks also occur, they are not shown in FIG. 7 because they are low in intensity.

Figure 25:
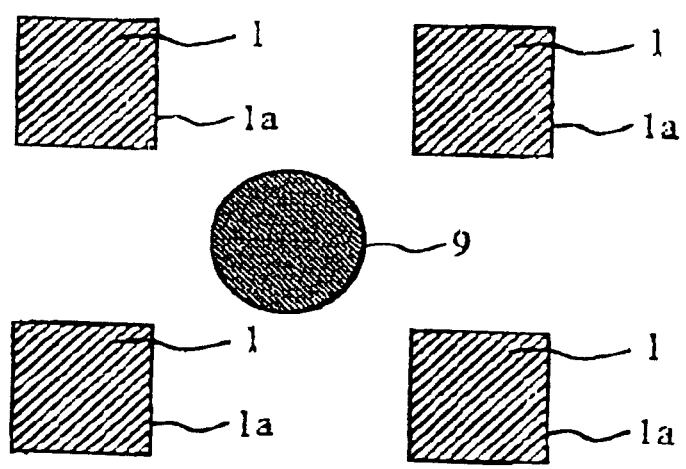
FIG. 25 shows a specific example of a halftone mask in a conventional pattern distortion detecting method.
Figure 26A:
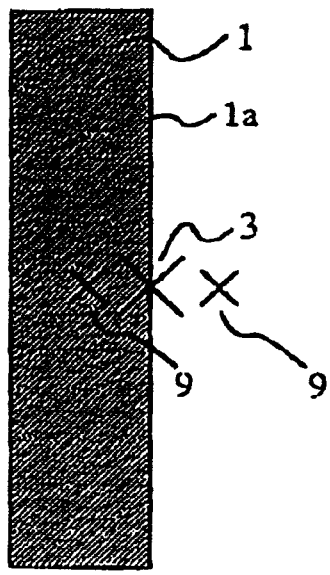
FIGS. 26(a) and 26(b) illustrate a conventional VTR (Variable Threshold Resist) model.
Figure 26B:
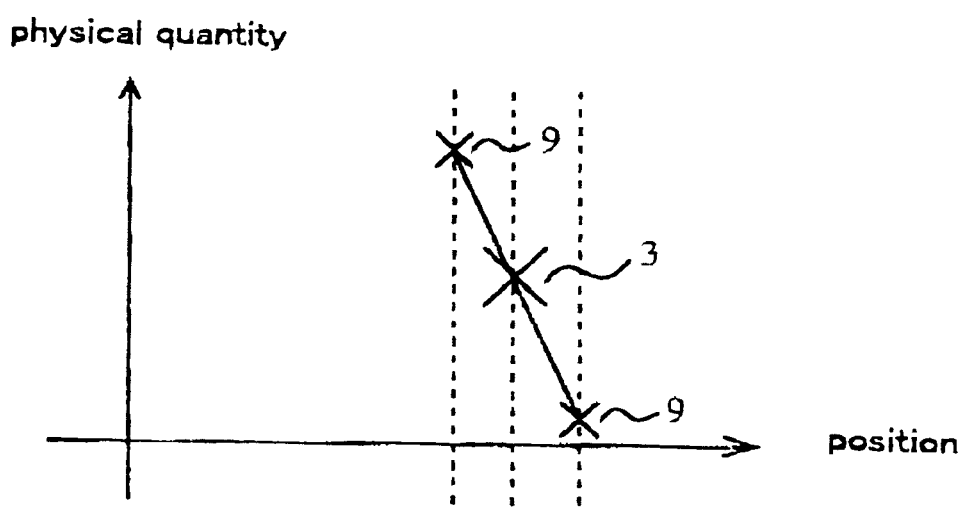

In a halftone mask, there sometimes occurs a case that a first-order peak occurring around a transparent portion and light passing through a shifter portion are added together in intensity, and a resist that is exposed to resulting light causes formation of a pattern (dimple) at an undesired location. FIG. 25 shows a specific example of such an event. In FIG. 25, reference numeral 1 denotes layout patterns and 9 denotes a pattern distortion outside the layout patterns 1.

Where a sampling line is generated in a portion distant from pattern edges by a predetermined value, a pattern distortion that is formed in a portion distant from a pattern edge portion by a first-order peak of light that has passed through, for example, the boundary between a transparent portion and an opaque portion can be detected and corrected by setting a sampling line in a portion distant from the pattern edge portion by the distance of the first-order peak and generating sampling points on the thus-set sampling line, as described above. It is known that such a pattern distortion can be avoided by providing a transparent portion that is smaller in size than an exposure limit or providing an opaque portion, or like methods. As described above, a pattern distortion can be corrected by similar methods.

As described above, in this embodiment, since sampling points are set selectively at positions distant from pattern edges by a predetermined value, a pattern distortion in a portion other than the pattern edge portion, that is, in a portion distant from the pattern edges can be detected and corrected at high speed without the need for making calculations for the entire layout pattern.

Third Embodiment

A pattern distortion detecting apparatus and method according to a third embodiment of the invention, which are similar to those of the first embodiment, will be described below with auxiliary reference to FIGS. 1 and 2. The components and operations in the third embodiment that are the same as in the first embodiment will be described in a simplified manner or will not be described at all to avoid redundant descriptions.

In particular, the third embodiment is different from the second embodiment in that non-edge-portion sampling point generation rules that are held by the non-edge-portion sampling point generation rules holding section 9 shown in FIG. 1 are assumed to be as follows.

Sampling point generation rules: "generate sampling lines in portions distant from a plurality of pattern edges by a predetermined value, respectively, and set a sampling point at a point where a predetermined number or more of sampling lines intersect each other."

Figure 8:
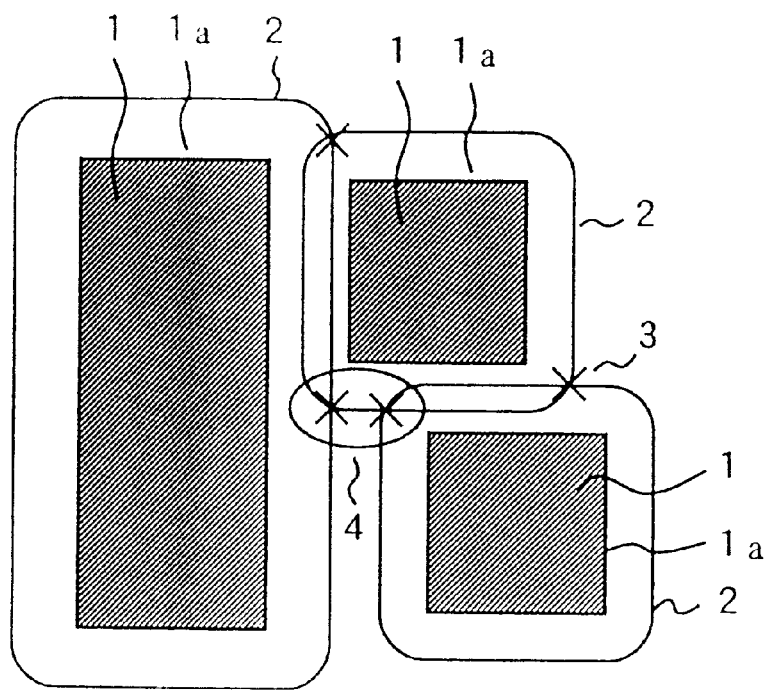
FIG. 8 illustrates a relationship between layout patterns and sampling points for description of the third embodiment.

FIG. 8 illustrates a relationship between layout patterns and sampling points for description of the third embodiment. In FIG. 8, reference symbol 1 denotes layout patterns, 1a denotes pattern edge portions, and 2 denotes sampling lines. Reference numeral 3 denotes a point where sampling lines of adjacent patterns intersect each other. In this embodiment, as in the case of the second embodiment, each sampling line 2 is a set of points that are distant from the edge portion 1a of the associated layout pattern 1 by a predetermined value. The third embodiment is different from the second embodiment in that each sampling point 3 is generated at a point where sampling lines 2 intersect each other.

As described in the second embodiment, in a halftone mask, a pattern is formed in a portion where the sum of a first-order peak (indicated by numeral 72 in FIG. 7) and the intensity of light of a phase shifter portion reaches an intensity value high enough to cause chemical reaction in a resist. Therefore, a pattern is formed at a point where a predetermined number or more of sampling lines intersect each other. The method of this embodiment can make the number of sampling points smaller than in the second embodiment and thereby increase the processing speed by generating sampling points only at points where a predetermined number or more of sampling lines intersect each other.

Where a sampling point is to be generated at a point where two sampling lines intersect each other, a sampling point 3 is generated at their intersecting point.

On the other hand, for intersection of three or more sampling lines, the concept of the sampling line needs to be extended. Where the sampling line is defined as a geometrically defined line (line width: 0), it is rare that three or more sampling lines intersect each other. However, since a first-order peak as shown in FIG. 7 has a certain width, in actuality, the sum of light intensity values is considered high enough to cause chemical reaction in a resist at a portion where three sampling lines do not intersect each other but intersecting points of two sampling lines are close to each other (indicated by numeral 4 in FIG. 8).

Therefore, where a sampling point is to be generated at a point where three or more sampling lines intersect each other, a process is executed in which a sampling line width is set and a sampling point is generated in a portion where a predetermined number or more of extended sampling lines (having a width) intersect each other (i.e., an ANDed portion of the expanded sampling lines). For example, it is effective to generate a sampling point at the center of gravity of this portion.

Where a predetermined number or more of intersecting points of two zero-width sampling lines exist within a predetermined distance, a sampling point can be generated by employing a method in which a sampling point is generated at the center of gravity of those intersecting points.

Where sampling lines are to be generated in portions distant from a plurality of pattern edges by a predetermined value, a pattern distortion that is formed in a portion distant from a pattern edge portion by a first-order peak can be detected and corrected by setting sampling lines in portions distant from the pattern edge portion by the distance of a first-order peak of light that has passed through, for example, the boundary between a transparent portion and an opaque portion and generating a sampling point at the intersecting point of those sampling lines or in a portion where a plurality of intersecting points of sampling lines exist close to each other, as described above.

As described above, because a sampling point is generated at an intersecting point of a predetermined number or more of sampling lines (each being a set of points distant from pattern edges by a predetermined value), the third embodiment can make the number of sampling points smaller than in the second embodiment and thereby detect and correct a pattern distortion in a portion other than pattern edge portions faster than in the second embodiment.

Fourth Embodiment

A pattern distortion detecting apparatus and method according to a fourth embodiment of the invention, which are similar to those of the first embodiment, will be described below with auxiliary reference to FIGS. 1 and 2. The components and operations in the fourth embodiment that are the same as in the first embodiment will be described in a simplified manner or will not be described at all to avoid redundant descriptions.

In particular, the fourth embodiment is different from the second and third embodiments in that non-edge-portion sampling point generation rules that are held by the nonedge-portion sampling point generation rules holding section 9 shown in FIG. 1 are assumed to be as follows.

Sampling point generation rules: "generate a sampling line in a portion distant from the center of gravity of a pattern by a predetermined value and set sampling points on the sampling line; or generate sampling lines in portions distant from the centers of gravity of respective patterns by a predetermined value and set a sampling point at a point where a predetermined number or more of sampling lines intersect each other."

Figure 9:
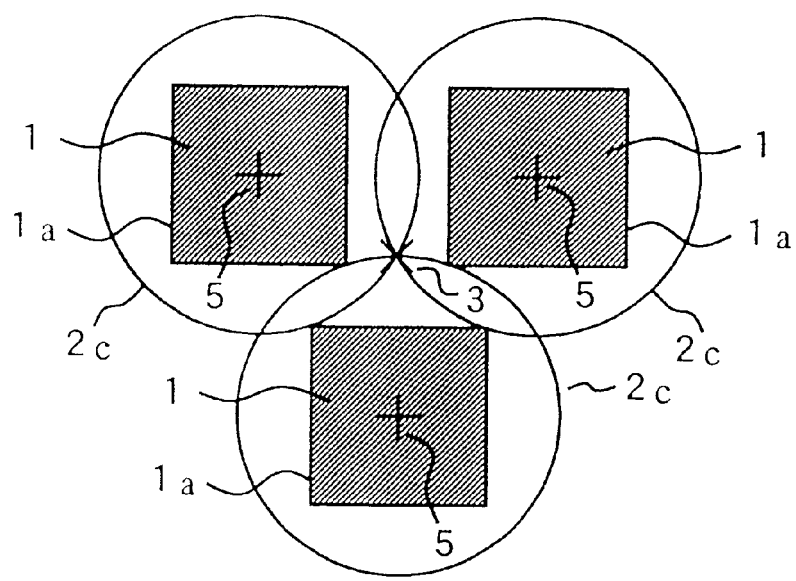
FIG. 9 illustrates a relationship between layout patterns and a sampling point for description of the fourth embodiment.

FIG. 9 illustrates a relationship between layout patterns and a sampling point for description of the fourth embodiment. In FIG. 9, reference symbol 1 denotes layout patterns, 1a denotes pattern edges, and 2c denotes sampling lines. Reference numeral 3 denotes a sampling point that is set at a point where the three sampling lines 2c intersect each other. Reference numeral 5 denotes the center of gravity of each layout pattern 1. In this embodiment, unlike the case of the second and third embodiments, each sampling line 2c is a set of points that are distant from the center of gravity 5 of the associated layout pattern 1 by a predetermined value. The fourth embodiment is the same as the second and third embodiment in the other points, which will not be described below.

Figure 10:
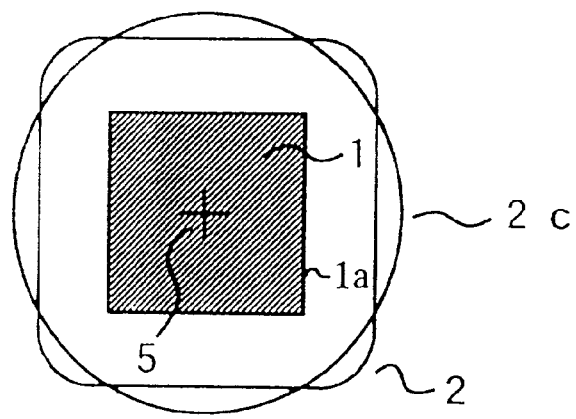
FIG. 10 shows a square layout pattern and a sampling line according to the fourth embodiment.

FIG. 10 shows a square layout pattern 1, a sampling line 2c that is distant from the center of gravity 5 of the layout pattern 1 by a predetermined value, and a set of points that are distant from edges 1a by a predetermined value, that is, a sampling line 2 according to the definitions of the second and third embodiments.

It is known that in general the sizes of square patterns like the one shown in FIG. 10 in LSIs are so small as to be approximately equal to an exposure wavelength and hence those square patterns produce circular optical images. Therefore, the position of a first-order peak of a square pattern can be expressed more accurately by a distance from the center of gravity of the pattern, that is, a circle, than a distance from the edges.

Where sampling lines are to be generated in portions distant from the centers of gravity of respective patterns by a predetermined value, a pattern distortion that is formed in a portion distant from a pattern edge portion(s) by a first-order peak can be detected and corrected by setting a sampling line(s) in a portion(s) distant by the distance of a first-order peak of light that has passed through, for example, the boundary between a transparent portion and an opaque portion and generating sampling points on the sampling line or generating a sampling point at an intersecting point of those sampling lines, as described above.

As described above, in this embodiment, for a square layout pattern such as a hole pattern or a layout pattern close to it in shape, points where to set sampling points are prescribed by a distance from the center of gravity of the pattern rather than a distance from the pattern edges. Therefore, the fourth embodiment can generate sampling points more accurately than the second and third embodiments.

Fifth Embodiment

A pattern distortion detecting apparatus and method according to a fifth embodiment of the invention, which are basically similar to those of the first embodiment, will be described below with auxiliary reference to FIGS. 1 and 2. The components and operations in the fifth embodiment that are the same as in the first embodiment will be described in a simplified manner or will not be described at all to avoid redundant descriptions.

In particular, the fifth embodiment is different from the fourth embodiment in that non-edge-portion sampling point generation rules that are held by the non-edge-portion sampling point generation rules holding section 9 shown in FIG. 1 are assumed to be as follows.

Sampling point generation rules: generate an elliptical sampling line in accordance with the dimensions of a layout pattern so that the center of the sampling line coincides with the center of gravity of the layout pattern and set sampling points on the sampling line; or generate elliptical sampling lines in accordance with the dimensions of respective layout patterns so that the centers of the sampling lines coincide with the centers of gravity of the respective layout patterns and set a sampling point at a point where a predetermined number or more of sampling lines intersect each other.

Figure 11:
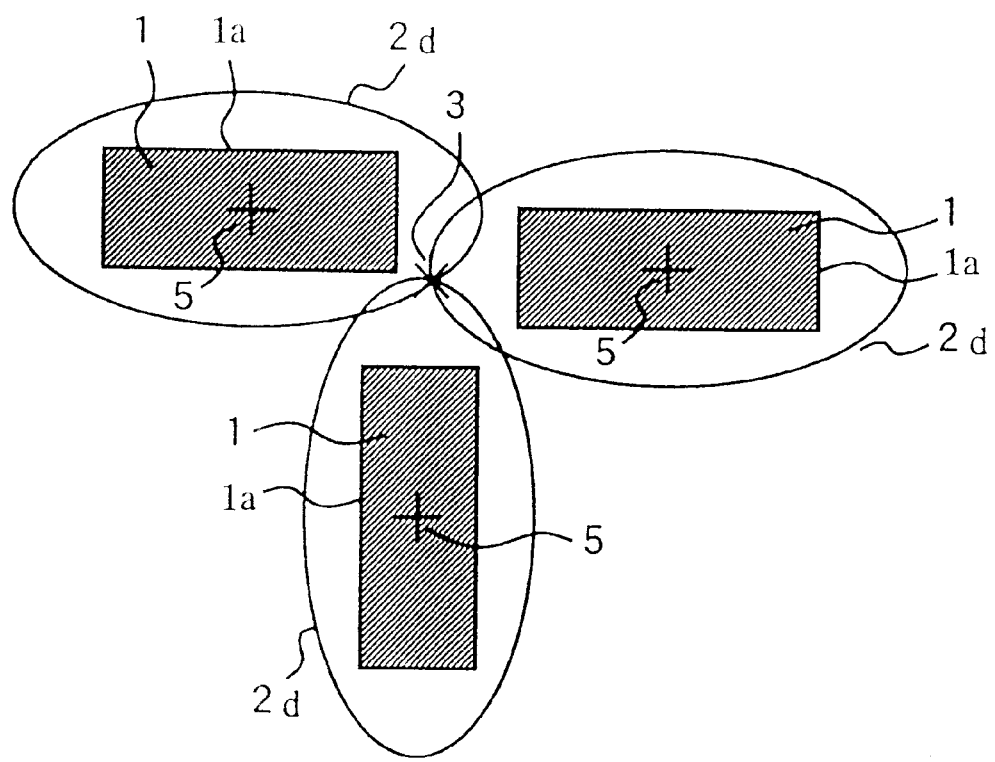
FIG. 11 illustrates a relationship between layout patterns and a sampling point for description of the fifth embodiment.

FIG. 11 illustrates a relationship between layout patterns and a sampling point for description of the fifth embodiment. In FIG. 11, reference symbol 1 denotes layout patterns, 1a denotes pattern edges, and 2d denotes sampling lines. Reference numeral 3 denotes a sampling point that is set at a point where the sampling lines 2d intersect each other. Reference numeral 5 denotes the center of gravity of each layout pattern 1. In this embodiment, unlike the case of the fourth embodiment, each sampling line 2d is an ellipse whose center coincides with the center of gravity 5 of the associated layout pattern 1.

Figure 12:
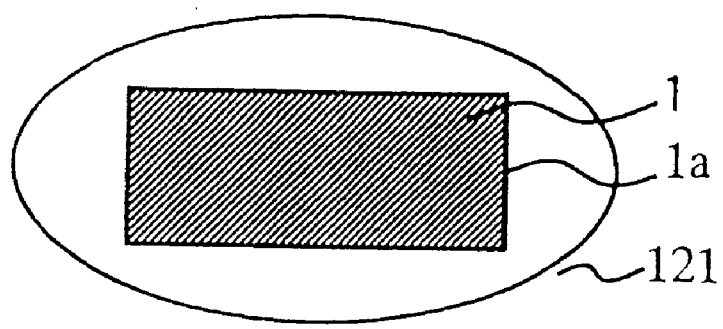
FIG. 12 shows a rectangular layout pattern and a first-order peak of its optical intensity in the fifth embodiment.

FIG. 12 shows a rectangular layout pattern 1 and a first-order peak 121 of its optical intensity. A first-order peak of a rectangular pattern sometimes assumes a shape that is closer to an ellipse than a circle. Further, it is known that, for example, when an aperture shape of a stepper has different dimensions in the x and y-directions depending on exposure illumination conditions, a square layout pattern may produce an elliptical image.

Figure 13:
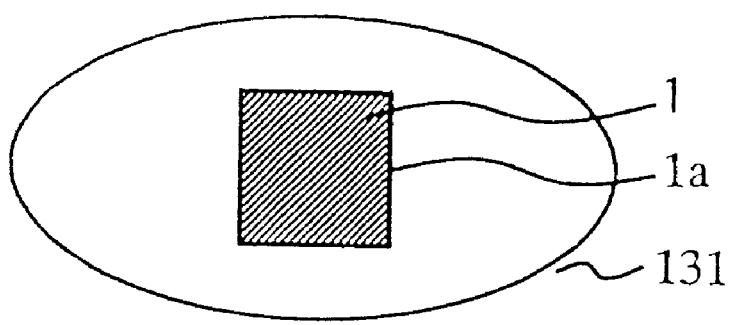
FIG. 13 shows a square pattern and a first-order peak of its optical intensity in the fifth embodiment.
Figure 14:
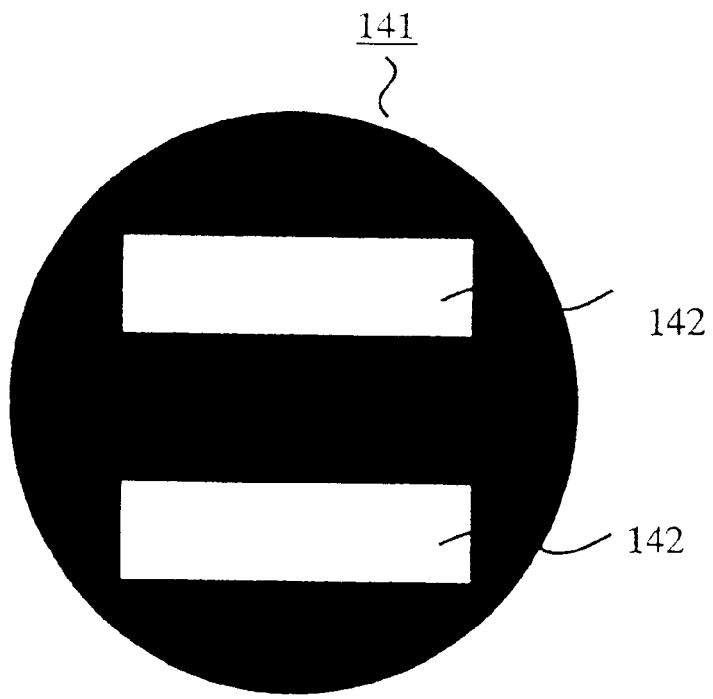
FIG. 14 shows a specific example of shapes of apertures in a photomask used in a stepper in the fifth embodiment.

FIG. 13 shows a square pattern 1 and a first-order peak 131 that may appear in the above situation. FIG. 14 shows a specific example of shapes of apertures 142 of a stepper that are formed in a photomask 141 and have different dimensions in the x and y-directions. This embodiment can be applied to such a case.

Where sampling lines are to be generated in portions distant from the centers of gravity of respective patterns by a predetermined value, a pattern distortion that is formed in a portion distant from a pattern edge portion(s) by a first-order peak can be detected and corrected by setting a sampling line(s) on an ellipse(s) distant by the distance of a first-order peak of light that has passed through, for example, the boundary between a transparent portion and an opaque portion and generating sampling points on the sampling line or generating a sampling point at the intersecting point of sampling lines, as described above.

As described above, in this embodiment, the distance is prescribed by an ellipse in accordance with the dimensions (Sx, Sy) of a rectangular hole pattern and/or process conditions (e.g., optical conditions that are different in the x and y-directions), and other factors. Therefore, the fifth embodiment can generate sampling points more accurately than the fourth embodiment.

Sixth Embodiment

A pattern distortion detecting apparatus and method according to a sixth embodiment of the invention, which are basically similar to those of the first embodiment, will be described below with auxiliary reference to FIGS. 1 and 2. The components and operations in the sixth embodiment that are the same as in the first embodiment will be described in a simplified manner or will not be described at all to avoid redundant descriptions.

In particular, the sixth embodiment is different from the first embodiment in that non-edge-portion sampling point generation rules that are held by the non-edge-portion sampling point generation rules holding section 9 shown in FIG. 1 are assumed to be as follows.

Sampling point generation rules: "set a sampling line at a position equidistant from a pattern edge and another pattern edge that is adjacent to and close to it and generate sampling points on the sampling line."

There are two kinds of sampling lines. Namely, a sampling line that is set at a position between a reference pattern edge and a pattern edge outside the figure, and a sampling line that is set at a position between a reference pattern edge and a pattern edge inside the figure. The former is called an external sampling line and the latter is called an internal sampling line.

Figure 15:
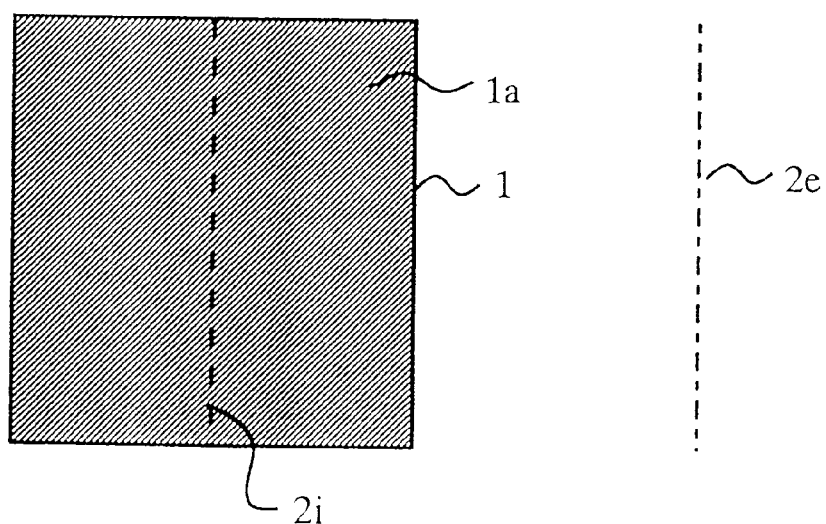
FIGS. 15 and 16 illustrate relationships between a layout patterns and a sampling point for description of the sixth embodiment.
Figure 16:
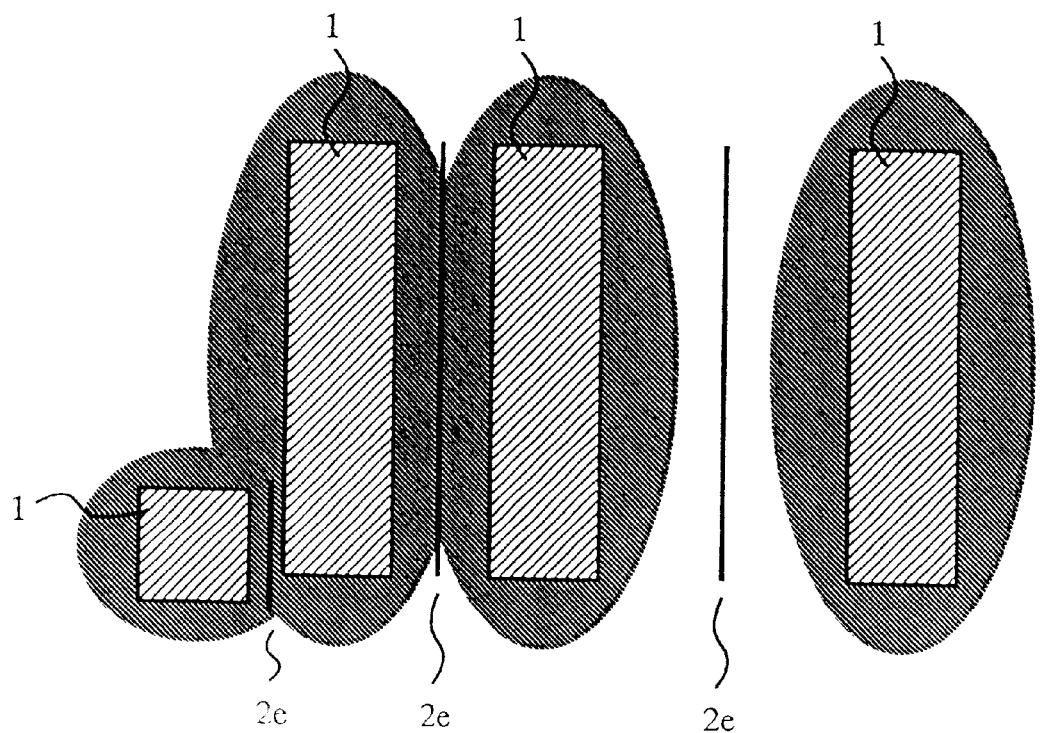

FIGS. 15 and 16 illustrate relationships between a layout pattern(s) and a sampling point for description of the sixth embodiment. In FIGS. 15 and 16, reference symbol 1 denotes a layout pattern(s); 1a, a pattern edge; 2e, external sampling lines; and 2i, an internal sampling line. In this embodiment, each of the sampling lines 2e and 2i is a set of points that are equidistant from a layout pattern edge 1a and another pattern edge 1a that is close to it. Sampling points are generated on the sampling lines 2e and 2i.

The example of detection of a bridging portion of line-and-space patterns was described in the second embodiment.

In the second embodiment, a bridging portion cannot be detected correctly when line-and-space patterns have wide and narrow intervals in mixed form. In contrast, in this embodiment, the bridging portion can be detected irrespective of the interval between patterns 1 by generating sampling points on the external sampling line 2e as shown in FIG. 16.

Figure 17:
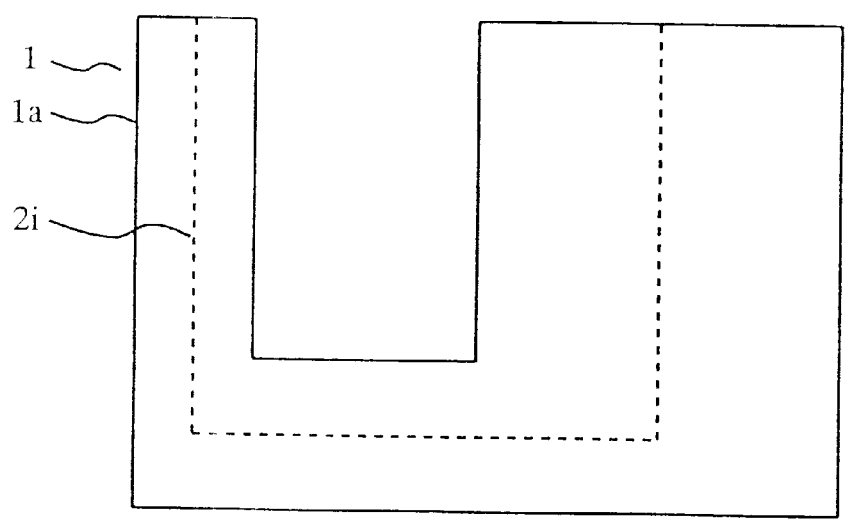
FIG. 17 illustrate another relationships between a layout patterns and a sampling point for description of the sixth embodiment.

Further, whether a sufficiently dark (or bright) portion exists inside a pattern can be detected by setting sampling points on the internal sampling line 2i as shown in FIG. 17. Where a sampling line is to be generated in a portion distant from pattern edges by a predetermined value, a pattern distortion in a portion distant from a pattern edge portion can be detected and corrected by setting sampling lines at positions equidistant from a pattern edge and another pattern edge that is located adjacent to and close to it inside or outside the pattern and generating sampling points on the sampling line, as described above.

As described above, the method of this embodiment can detect and correct a pattern distortion in a portion other than pattern edge portions at high speed and with high accuracy, for example, in a case where adjacent pattern edges have wide and narrow intervals in mixed form.

Seventh Embodiment

A pattern distortion detecting apparatus and method according to a seventh embodiment of the invention, which are basically similar to those of the first embodiment, will be described below with auxiliary reference to FIGS. 1 and 2. The components and operations in the seventh embodiment that are the same as in the first embodiment will be described in a simplified manner or will not be described at all to avoid redundant descriptions.

In particular, the seventh embodiment is different from the six embodiment in that non-edge-portion sampling point generation rules that are held by the non-edge-portion sampling point generation rules holding section 9 shown in FIG. 1 are assumed to be as follows.

Sampling point generation rules: "set a sampling line at a position equidistant from the center of gravity of a pattern and the center of gravity of another pattern that is adjacent to and close to it and generate a sampling point on the sampling line."

As described above, in square patterns or the like, it is desirable to set a sampling line by using the center of gravity of a pattern, rather than pattern edges, as a reference.

Figure 18:
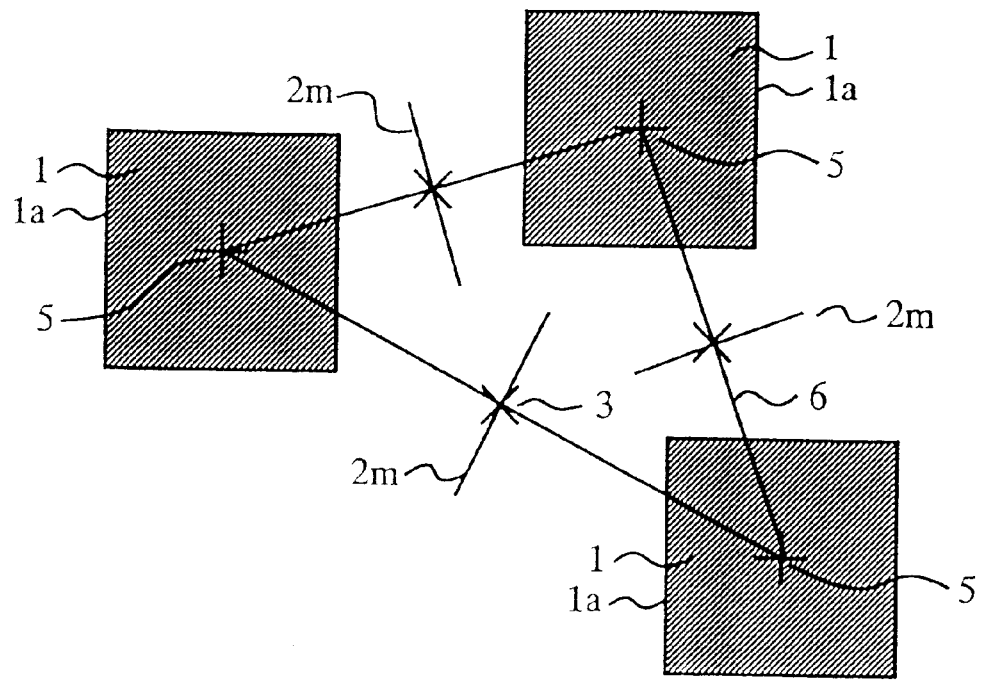
FIG. 18 illustrates a relationship between layout patterns and sampling points for description of the seventh embodiment.

FIG. 18 illustrates a relationship between layout patterns and sampling points for description of the seventh embodiment. In FIG. 18, reference symbol 1 denotes layout patterns; 1a, pattern edges; 2m, sampling lines; 3, sampling points; 5, centers of gravity of patterns; and 6, line segments each connecting the centers of gravity 5 of patterns. In this case, each sampling line 2m is a line equidistant from the centers of gravity 5 of patterns and each sampling point 3 is set at the middle point between the centers of gravity 5 of patterns. In other words, each sample point 3 is set at an intersecting point of the associated sampling line 2m and the associated segment 6 that connects the centers of gravity 5 of patterns.

This embodiment is different from the sixth embodiment in that each sampling point 3 is set based on the distance between the centers of gravity 5 rather than the distance between pattern edges 1a.

Where a sampling line is to be generated in a portion distant from pattern edges by a predetermined value, a pattern distortion in a portion distant from a pattern edge portion can be detected and corrected by generating a sampling point at the middle point between the centers of gravity of adjacent patterns, as described above.

As described above, the method of this embodiment can detect and correct a pattern distortion in a portion other than pattern edge portions more accurately than the sixth embodiment.

Eighth Embodiment

A pattern distortion detecting apparatus and method according to an eighth embodiment of the invention, which are basically similar to those of the first embodiment, will be described below with auxiliary reference to FIGS. 1 and 2. The components and operations in the eighth embodiment that are the same as in the first embodiment will be described in a simplified manner or will not be described at all to avoid redundant descriptions.

In particular, the eighth embodiment is different from the first embodiment in that non-edge-portion sampling point generation rules that are held by the non-edge-portion sampling point generation rules holding section 9 shown in FIG. 1 are assumed to be as follows.

Sampling point generation rules: "perform a graphic operation(s) on layout pattern and/or between a layout pattern and a pattern in another layer and generate sampling points in a portion that is included in an area (sampling area) obtained by the graphic operation(s)."

There are conventional methods in which a criterion of setting sampling points on pattern edges is prescribed by a graphic operation on a layout pattern or between a layout pattern and a pattern in another layer. This embodiment is different from those conventional methods in that a sampling area is set in a portion other than an edge portion and sampling points are generated in a portion included in the sampling area.

Figure 19:
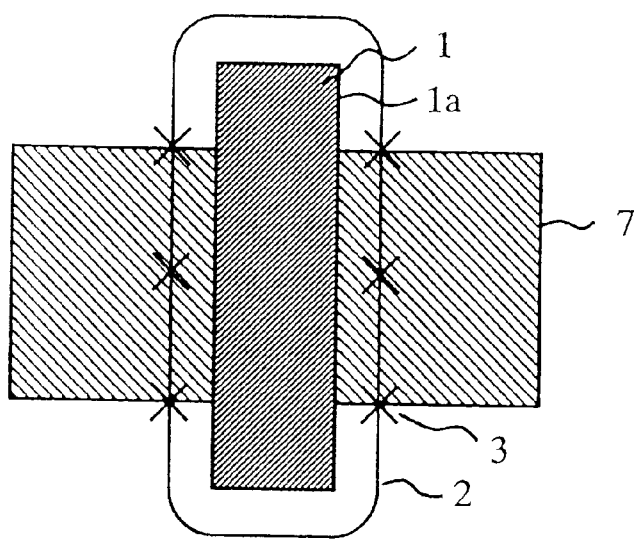
FIG. 19 is illustrates a relationship between layout patterns and sampling points for description of the eighth embodiment.

FIG. 19 is illustrates a relationship between layout patterns and sampling points for description of this embodiment. In FIG. 19, reference symbol 1 denotes a layout pattern; 1a, pattern edges; 2, a sampling line; 7, a layout pattern in another layer; and 3, sampling points.

This example is directed to a case where the layout pattern 7 in another layer is employed as a sampling area, a sampling area can be set by a graphic operation (AND, OR, XOR, NOT, or sizing) between a layout pattern and a layout pattern in another layer. Sampling points are set in the sampling area. In this specific example, the sampling points 3 are set on the sampling line 2 and within the sampling area.

Where a sampling line is to be generated in a portion distant from pattern edges by a predetermined value, a pattern distortion in a portion distant from a pattern edge portion can be detected and corrected by generating sampling points only in a portion included in a flag that is determined by a graphic operation (AND, OR, XOR, NOT, or sizing) between patterns in different layers, as described above.

As described above, this embodiment can detect and correct a pattern distortion in a portion other than pattern edges for a restricted portion of a layout pattern rather than the entire layout pattern.

Although the embodiments have been described above individually, it is apparent that more varied pattern distortions can be detected and corrected by combining plural ones of the above embodiments.

The term "layout pattern" as used in the embodiments includes a design layout pattern, a corrected pattern, etc.

A computer-readable recording medium on which a program for causing a computer to execute a pattern distortion detecting method of the invention is recorded was described only in the first embodiment. However, it is apparent that, similarly, the process of any of the other embodiments can be executed by a computer by recording a program for causing the computer to execute the process on a recording medium. Detailed descriptions for recording mediums according to the other embodiments are omitted to avoid redundant descriptions.

The effects and advantages of the present invention may be summarized as follows.

According to a first aspect of the invention, there is provided a pattern distortion detecting method in which sampling points are set selectively in a portion other than the pattern edge portion of a layout pattern and pattern distortion amounts are detected for the respective sampling points. Therefore, a pattern distortion distant from a pattern edge can be detected and corrected at high speed without the need for performing calculations for the entire layout pattern.

Sampling points may be set selectively at positions distant from a pattern edge portion by a predetermined value. This is effective in detecting and correcting a pattern distortion in a portion distant from a pattern edge portion by a predetermined distance at high speed without the need for performing calculations for the entire layout pattern.

A sampling point may be set at an intersecting point of a plurality of sampling lines that are distant from a plurality of pattern edge portions, respectively. This is effective in detecting and correcting a pattern distortion in a portion distant from a plurality of pattern edge portions by a predetermined value at high speed without the need for performing calculations for the entire layout patterns.

Sampling points may be set selectively at positions distant from the center of gravity of a square or substantially square layout pattern. This is effective in detecting and correcting a pattern distortion in a portion distant from a pattern edge portion by a predetermined value at high speed without the need for performing calculations for the entire layout pattern.

A sampling point may be set at an intersecting point of a plurality of sampling lines that are distant from the centers of gravity of a plurality of square or substantially square layout patterns. This is effective in detecting and correcting a pattern distortion in a portion distant from a plurality of pattern edge portions by a predetermined value at high speed without the need for performing calculations for the entire layout patterns.

Sampling points may be set selectively at positions on an ellipse whose center coincides with the center of gravity of a layout pattern and that is distant from the center by a predetermined degree, for a substantially rectangular layout pattern or a certain process condition. This is effective in detecting and correcting a pattern distortion in a portion distant from a pattern edge portion by a predetermined value at high speed without the need for performing calculations for the entire layout pattern.

A sampling point may be set at an intersecting point of a plurality of ellipses whose centers coincide with the respective centers of gravity of a plurality of layout patterns and that are distant from the centers by a predetermined degree, for substantially rectangular layout patterns or a certain process condition for the plurality of layout patterns. This is effective in detecting and correcting a pattern distortion in a portion distant from a plurality of pattern edge portions by a predetermined value at high speed without the need for performing calculations for the entire layout patterns.

Sampling points may be set at positions that are equidistant from a plurality of pattern edges adjacent to each other. This is effective in detecting and correcting a pattern distortion in a portion distant from a pattern edge portion by a predetermined value at high speed without the need for performing calculations for the entire layout pattern.

A sampling point may be set at the middle point between the centers of gravity of layout patterns that are adjacent to each other. This is effective in detecting and correcting a pattern distortion in a portion distant from a pattern edge portion by a predetermined value at high speed without the need for performing calculations for the entire layout pattern.

Sampling points may be set selectively only in a portion included in a flag that is obtained by a graphic operation between layout patterns in different layers.

This is effective in detecting and correcting a pattern distortion in a portion distant from a pattern edge portion by a predetermined value at high speed without the need for performing calculations for the entire layout pattern.

According to a second aspect of the invention, there is provided a pattern distortion detecting apparatus in which sampling points are set selectively in a portion other than the pattern edge portion of a layout pattern and pattern distortion amounts are detected for the respective sampling points. Therefore, a pattern distortion distant from a pattern edge can be detected and corrected at high speed without the need for performing calculations for the entire layout pattern.

According to a third aspect of the invention, there is provided a recording medium which can cause a computer to execute a process of setting sampling points selectively in a portion other than the pattern edge portion of a layout pattern and detecting pattern distortion amounts for the respective sampling points. Therefore, a pattern distortion distant from a pattern edge can be detected and corrected at high speed without the need for performing calculations for the entire layout pattern.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-15676, filed on Jan. 25, 1999 including specification, claims, drawings and summary, on which the Convention priority of the present application is based, are incorporated herein by reference in its entirety.

What is claimed is:

1. A pattern distortion detecting method comprising the steps of:

generating sampling points selectively, under consideration of a layout pattern, in a prescribed portion other than a pattern edge portion of a layout pattern used in a semiconductor manufacturing process based on an input that is data of the layout pattern;

obtaining simulation results of a pattern to be generated from the layout pattern for the respective sampling points; and detecting pattern distortion amounts in the portion other than the pattern edge portion by comparing the data of the layout pattern and the simulation results for the respective sampling points.

2. The pattern distortion detecting method according to claim 1, further comprising the step of generating a corrected layout pattern by correcting the layout pattern based on the detected pattern distortion amounts.

3. The pattern distortion detecting method according to claim 1, wherein the sampling points are set selectively at positions distant from the pattern edge portion by a predetermined value.

4. The pattern distortion detecting method according to claim 1, wherein each of the sampling points is set at an intersecting point of a plurality of sampling lines that are formed as sets of points distant from a plurality of pattern edge portions.

5. The pattern distortion detecting method according to claim 1, wherein the sampling points are set selectively at positions distant from a center of gravity of a substantially square layout pattern.

6. The pattern distortion detecting method according to claim 1, wherein each of the sampling points is set at an intersecting point of a plurality of sampling lines that are formed as sets of points distant from centers of gravity of a plurality of substantially square layout patterns.

7. The pattern distortion detecting method according to claim 1, wherein the sampling points are set selectively at positions on an ellipse that has a center at a center of gravity of a layout pattern and is distant from the center by a predetermined degree, for a substantially rectangular layout pattern or a certain process condition.

8. The pattern distortion detecting method according to claim 1, wherein each of the sampling points is set at an intersecting point of a plurality of ellipses that have centers at centers of gravity of a plurality of layout patterns and are distant from the centers by a predetermined degree, for substantially rectangular layout patterns or a certain process condition for the plurality of layout patterns.

9. The pattern distortion detecting method according to claim 1, wherein the sampling points are set at positions that are equidistant from a plurality of pattern edges adjacent to each other.

10. The pattern distortion detecting method according to claim 1, wherein each of the sampling points is set at a middle point between centers of gravity of layout patterns that are adjacent to each other.

11. The pattern distortion detecting method according to claim 1, wherein the sampling points are set selectively only in a portion included in a flag that is obtained by a graphic operation between layout patterns in different layers.

* * * * *